United States Patent
Snygg et al.

(10) Patent No.: US 11,968,814 B2
(45) Date of Patent: Apr. 23, 2024

(54) WAVEGUIDE GASKET ARRANGEMENT

(71) Applicant: Telefonaktiebolaget LM Ericsson (publ), Stockholm (SE)

(72) Inventors: Göran Snygg, Partille (SE); Torbjörn Westin, Partille (SE); Henrik Pettersson, Lindome (SE); Gilbert Johansson, Gothenburg (SE); Jörgen Lundgren, Höviksnäs (SE); Martin Fagerström, Bollebygd (SE); Cecilia Lundin, Stenkullen (SE); Ove Persson, Hunnebostrand (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 349 days.

(21) Appl. No.: 17/619,729

(22) PCT Filed: Jun. 26, 2019

(86) PCT No.: PCT/SE2019/050622
§ 371 (c)(1),
(2) Date: Dec. 16, 2021

(87) PCT Pub. No.: WO2020/263138
PCT Pub. Date: Dec. 30, 2020

(65) Prior Publication Data
US 2022/0304202 A1 Sep. 22, 2022

(51) Int. Cl.
 *H01P 1/04* (2006.01)
 *H01P 3/12* (2006.01)
 (Continued)

(52) U.S. Cl.
CPC ......... *H05K 9/0015* (2013.01); *H01P 1/042* (2013.01); *H01P 3/12* (2013.01); *H01P 11/002* (2013.01); *H05K 9/0056* (2013.01)

(58) Field of Classification Search
CPC .. H01P 1/042; H01P 1/04; H01P 1/207; H01P 1/209; H01P 1/00; H01P 3/00;
(Continued)

(56) References Cited

U.S. PATENT DOCUMENTS 2,597,081 A * 5/1952 Goodhue ............... H01P 1/042
                                                    333/252
2,869,086 A    1/1959 Curtis et al.
(Continued)

FOREIGN PATENT DOCUMENTS

GB          654135 A        6/1951
JP         53073943 A  *    6/1978  ............. H01P 1/042
JP       H09312501 A       12/1997

OTHER PUBLICATIONS

Boccuni, et al., "The Logicality of Second-Order Logic: An Analysis in Terms of Plural Arbitrary Reference and Acts of Choice," Unity and Plurality: Logic, Philosophy, and Linguistics, Chapter 5, Jun. 2016, Oxford Scholarship Online, pp. 70-89.
(Continued)

*Primary Examiner* — Stephen E. Jones
(74) *Attorney, Agent, or Firm* — Withrow & Terranova, PLLC (57) ABSTRACT

The present disclosure relates to a waveguide gasket arrangement arranged for electrically sealing a waveguide interface between a first waveguide end and a second waveguide end, where the waveguide gasket arrangement comprises a first plurality of electrically conducting members connected to a first common structure along a first circumference. The waveguide gasket arrangement further comprises a second plurality of electrically conducting members connected to a second common structure along a second circumference. For each one of the first plurality of electrically conducting members and the second plurality of electrically conducting members there is a corresponding
(Continued)

first sub-plurality of electrically conducting members which are intended to contact a waveguide end, and a second sub-plurality of electrically conducting members which are intended to contact a corresponding intermediate electrically conducting structure that is positioned between the first plurality of electrically conducting members and the second plurality of electrically conducting members.

15 Claims, 7 Drawing Sheets

(51) Int. Cl.
*H01P 11/00* (2006.01)
*H05K 9/00* (2006.01)

(58) Field of Classification Search
CPC .. H01P 3/12; H01P 3/122; H01P 3/127; H01P 3/13; H01P 3/14; H01P 11/002; H05K 9/0015; H05K 9/0016; H05K 9/0056
See application file for complete search history.

(56) References Cited

U.S. PATENT DOCUMENTS

| 4,932,673 A | 6/1990 | Domnikov et al. |
| 2009/0058571 A1 | 3/2009 | Takemoto et al. |
| 2018/0034124 A1 | 2/2018 | Bolander et al. |

OTHER PUBLICATIONS

International Search Report and Written Opinion for International Patent Application No. PCT/SE2019/050622, dated Feb. 19, 2020, 9 pages.

* cited by examiner

WAVEGUIDE GASKET ARRANGEMENT

This application is a 35 U.S.C. § 371 national phase filing of International Application No. PCT/SE2019/050622, filed Jun. 26, 2019, the disclosure of which is incorporated herein by reference in its entirety.

TECHNICAL FIELD

The present disclosure relates to wireless communication systems, and in particular to a waveguide gasket arrangement adapted for electrically sealing a waveguide interface.

BACKGROUND

In many fields of wireless communication, such as microwave communication, as well as for applications associated with radars and other sensors using microwave technology, waveguides are used for transporting wireless signals, due to the low losses incurred in a waveguide. When mounting or connecting one waveguide section to another section, there is often a gap between the end-points of the sections.

When there is a gap between two waveguide sections in a waveguide arrangement, the electromagnetic field can partly escape the waveguide arrangement which affects return loss and transition loss, i.e. both unwanted reflections and losses occur. Counteracting such gaps by means of having high manufacturing tolerances is relatively costly, therefore different types of microwave gaskets are commonly used, for example resilient ring gaskets that comprise a conductive material. For example, U.S. Pat. No. 4,932,673 describes a gasket that comprises an electrically conductive elastomeric ring filled with metallic particles. There are also silicon rubber gaskets with conductive material inside. Another solution is RF gaskets where a thin metal plate comprise resilient angled fingers that provide a spring towards against a surface that should be sealed.

Such solutions work acceptable for frequencies up to about 20 GHz. For higher frequencies, the waveguide dimensions become relatively small and a resilient gasket tends to expand into the waveguide when compressed, changing the waveguide measures, which affects the transmission properties in an undesired manner. Furthermore, a silicon rubber gasket starts to get lossy for higher frequencies, requiring better and better quality of the silicon rubber to work on higher frequencies which adds significant cost and ends up in a poor trade of price and performance. For the case with resilient angled fingers, it is difficult to scale the fingers as the same gap need to be covered. As the fingers get longer, the electrical function degrade.

There is thus a need for an improved waveguide gasket arrangement that is cost-effective with low losses and low RF leakage while sealing a gap between waveguides in an efficient and reliable manner.

SUMMARY

It is an object of the present disclosure to provide an improved waveguide gasket arrangement that is cost-effective with low losses and low leakage while sealing a gap between waveguides in an efficient and reliable manner.

Said object is obtained by means of a waveguide gasket arrangement arranged for electrically sealing a waveguide interface between a first waveguide end and a second waveguide end. The waveguide gasket arrangement comprises a first plurality of electrically conducting members connected to a first common structure along a first circumference, and a second plurality of electrically conducting members connected to a second common structure along a second circumference. For each one of the first plurality of electrically conducting members and the second plurality of electrically conducting members there is a corresponding first sub-plurality of electrically conducting members which are intended to contact a waveguide end, and a second sub-plurality of electrically conducting members which are intended to contact a corresponding intermediate electrically conducting structure that is positioned between the first plurality of electrically conducting members and the second plurality of electrically conducting members.

In this manner, a waveguide gasket arrangement is proved where the electrical performance is significant better compared to prior such gaskets, without significant cost increase.

According to some aspects, the second sub-pluralities of electrically conducting members are intended to contact opposite sides of an intermediate electrically conducting structure.

According to some aspects, the waveguide gasket arrangement comprises at least one further plurality of electrically conducting members connected to a further common structure along a further circumference. Each further plurality of electrically conducting members comprises a first further sub-plurality of electrically conducting members which are intended to contact one intermediate electrically conducting structure, and a second further sub-plurality of electrically conducting members which are intended to contact another intermediate electrically conducting structure. Each further plurality of electrically conducting members is positioned between adjacent electrically conducting structures.

In this manner, there can be any desired number of electrically conducting members sandwiched with intermediate electrically conducting structures.

According to some aspects, each plurality of electrically conducting members circumvent a corresponding member aperture.

This enables signals to be transferred between the waveguide ends.

According to some aspects, each intermediate electrically conducting structure comprises an intermediate electrically conducting sheet with an intermediate aperture, where all apertures are adapted to be mutually aligned.

This enables an uncomplicated manufacture of the intermediate electrically conducting structures, and enables signals to be transferred between the waveguide ends.

According to some aspects, each common structure is constituted by a corresponding electrically conducting sheet.

In this way, an uncomplicated manufacture of the the plurality of electrically conducting members is enabled.

According to some aspects, the waveguide gasket arrangement is formed in a metal material.

This provides a rigid and durable structure.

According to some aspects, the waveguide gasket arrangement is formed by means of punching structures in metal sheets.

This enables an uncomplicated manufacture of the waveguide gasket arrangement.

According to some aspects, the waveguide gasket arrangement (1, 1') is formed in one piece.

This provides a waveguide gasket arrangement that is constituted by a single component.

According to some aspects, for each plurality of electrically conducting members, every second conducting member is comprised in the first sub-plurality of electrically conducting members, and every other second conducting member is comprised in the second sub-plurality of electrically conducting members.

In this manner, a reliable electrical contact and low RF losses is obtained.

This object is also obtained by means of methods that are associated with the above advantages.

BRIEF DESCRIPTION OF THE DRAWINGS

The present disclosure will now be described more in detail with reference to the appended drawings, where.

DETAILED DESCRIPTION

Aspects of the present disclosure will now be described more fully hereinafter with reference to the accompanying drawings. The different devices, systems, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Figure 1:
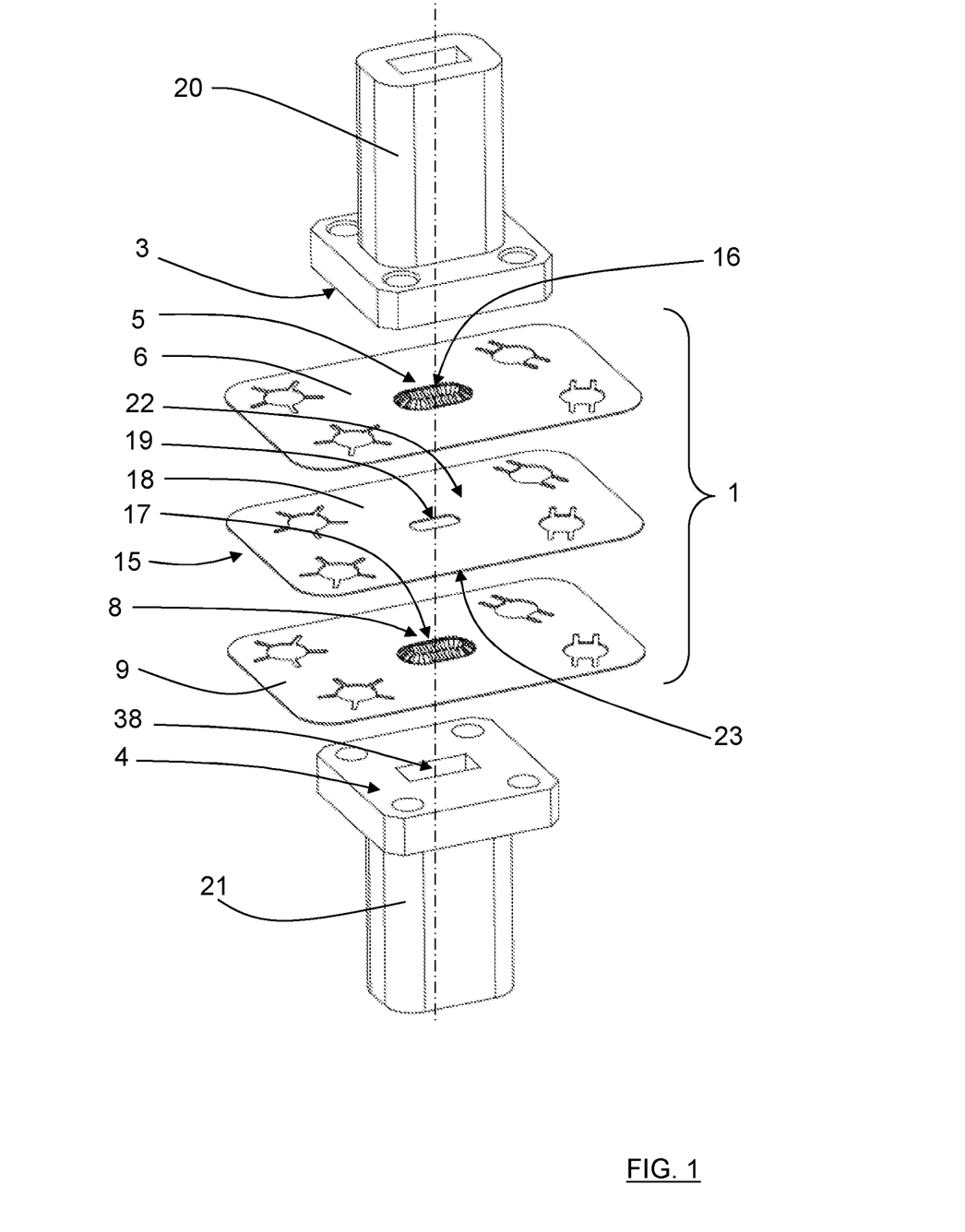
FIG. 1 shows a schematic perspective exploded view of a first example of a waveguide gasket arrangement together with two waveguide parts.

With reference to FIG. 1, showing a first example, there is a first waveguide part 20 with a first waveguide end 3 and a second waveguide part 21 with a second waveguide end 4, where the further is a waveguide gasket arrangement 1 arranged for electrically sealing a waveguide interface 2 between the first waveguide end 3 and the second waveguide end 4.

Figure 2:
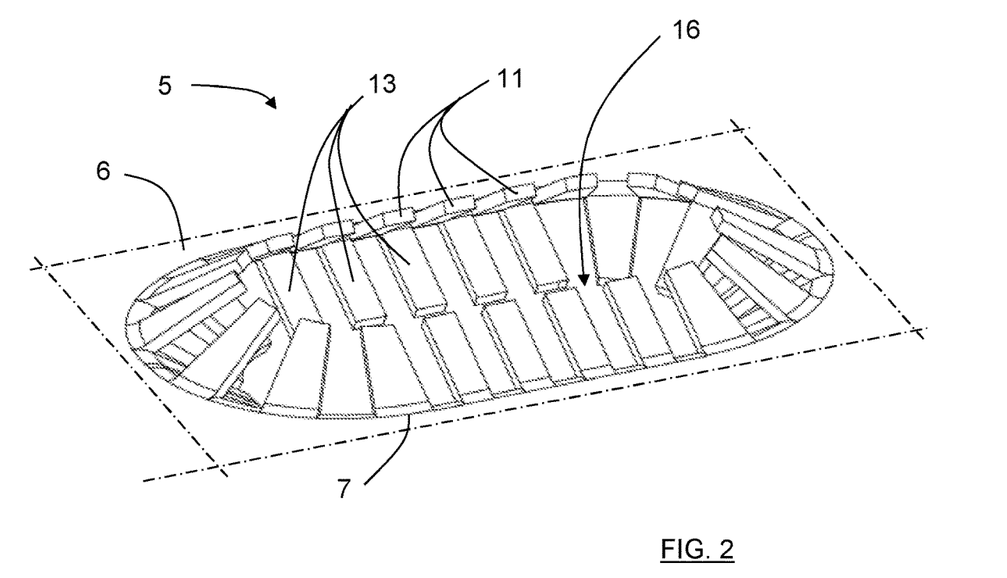
FIG. 2 shows a schematic perspective side view of a first plurality of electrically conducting members.

With reference also to FIG. 2, the waveguide gasket arrangement 1 comprises a first plurality of electrically conducting members 5 connected to a first common structure 6 along a first circumference 7.

Figure 4:
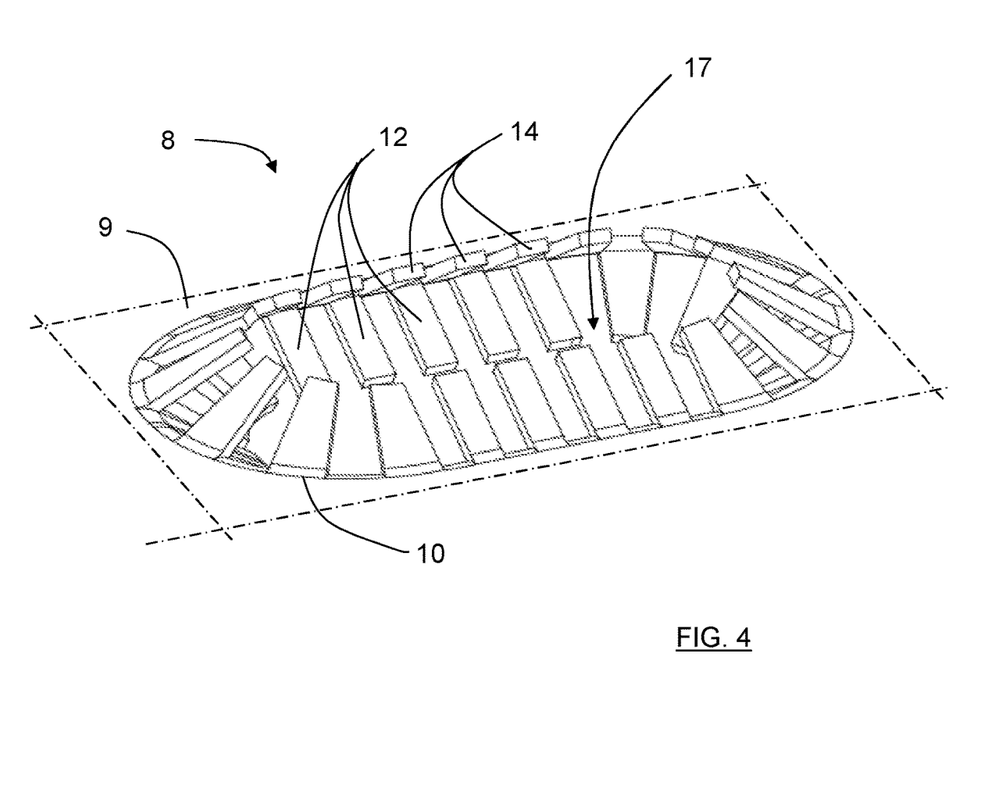
FIG. 4 shows a schematic perspective side view of a first plurality of electrically conducting members.
Figure 5:
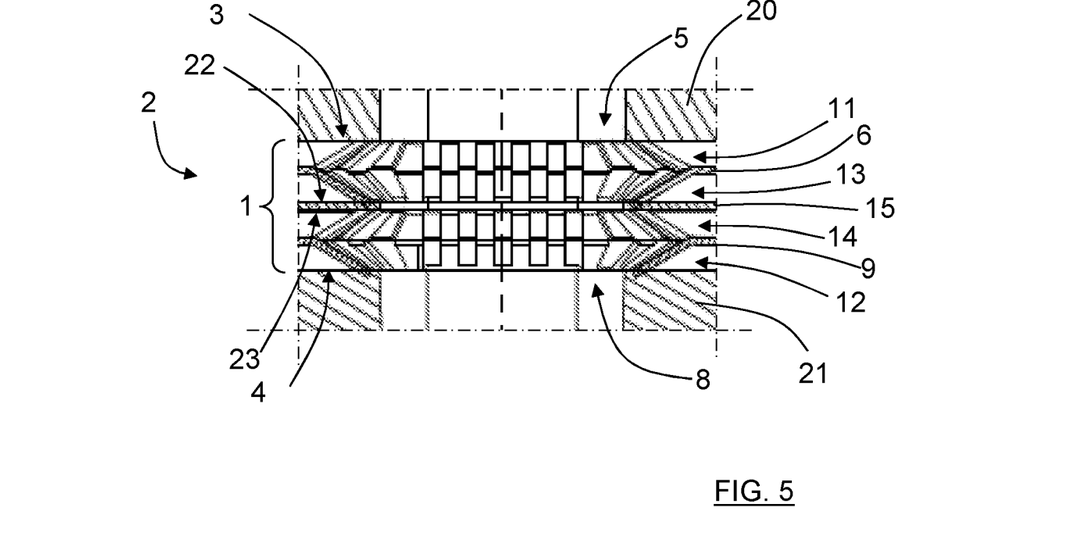
FIG. 5 shows a section side view of a waveguide interface with the waveguide gasket arrangement.
Figure 6:
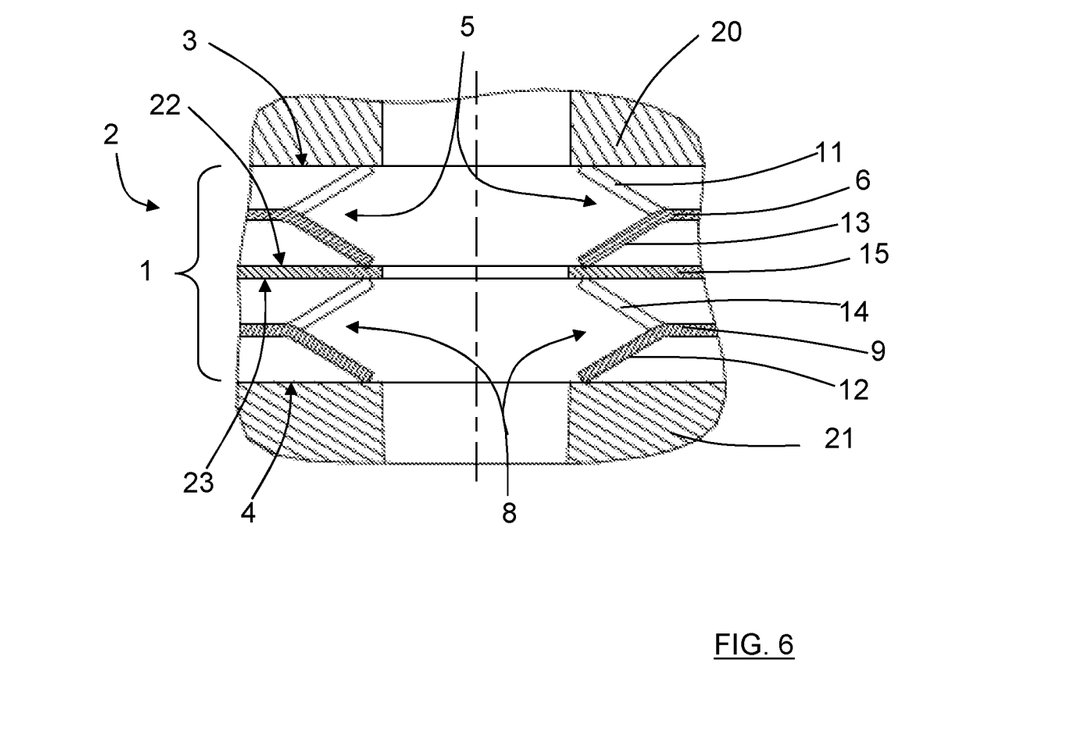
FIG. 6 shows a simplified and enlarged section side view of a waveguide interface with the waveguide gasket arrangement.

According to the present disclosure, with reference also to FIG. 4, FIG. 5 and FIG. 6, the waveguide gasket arrangement 1 comprises a second plurality of electrically conducting members 8 connected to a second common structure 9 along a second circumference 10. According to some aspects, each plurality of electrically conducting members 5, 8 circumvent a corresponding member aperture 16, 17, and each common structure 6, 9 is constituted by an electrically conducting sheet.

Furthermore, for each one of the first plurality of electrically conducting members 5 and the second plurality of electrically conducting members 8, there is a corresponding first sub-plurality of electrically conducting members 11, 12 which are intended to contact a waveguide end 3, 4, and a second sub-plurality of electrically conducting members 13, 14 which are intended to contact an intermediate electrically conducting structure 15. The intermediate electrically conducting structure 15 is positioned between the first plurality of electrically conducting members 5 and the second plurality of electrically conducting members 8.

This means that for the first plurality of electrically conducting members 5 there are some conducting members forming the first sub-plurality of electrically conducting members 11 which are directed are directed towards, and are intended to contact, the first waveguide end 3, and some conducting members forming the second sub-plurality of electrically conducting members 13 which are directed are directed towards, and are intended to contact, the intermediate electrically conducting structure 15.

This also means that for the second plurality of electrically conducting members 8 there are some conducting members forming the first sub-plurality of electrically conducting members 12 which are directed are directed towards, and are intended to contact, the second waveguide end 4, and some conducting members forming the second sub-plurality of electrically conducting members 14 which are directed are directed towards, and are intended to contact, the intermediate electrically conducting structure 15.

The second sub-pluralities of electrically conducting members 13, 14 are according to some aspects intended to contact opposite sides 22, 23 of the intermediate electrically conducting structure 15.

According to some aspects and with reference to FIG. 2 and FIG. 4, in order to achieve this, for each plurality of electrically conducting members 5, 8, every second conducting member is comprised in the first sub-plurality of electrically conducting members 11, 12, and every other second conducting member is comprised in the second sub-plurality of electrically conducting members 13, 14.

Figure 3:
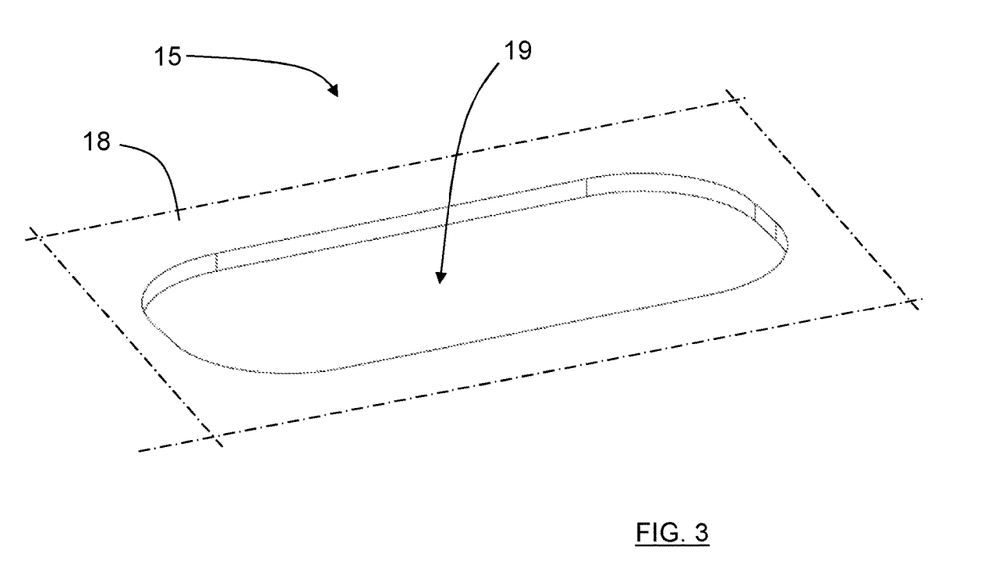
FIG. 3 shows a schematic perspective side view of an intermediate electrically conducting structure.

According to some aspects and with reference to FIG. 1 and FIG. 3, the intermediate electrically conducting structure 15 comprises an intermediate electrically conducting sheet 18 with an intermediate aperture 19, where all apertures 16, 17, 19 are adapted to be mutually aligned when the waveguide gasket arrangement 1 is arranged for electrically sealing the waveguide interface 2. Then, the apertures 16, 17, 19 are also aligned with waveguide openings 38 (only one shown in FIG. 1) such that a signal can be transferred from the first waveguide part 20 to the second waveguide part 21 via the apertures 16, 17, 19.

Figure 7:
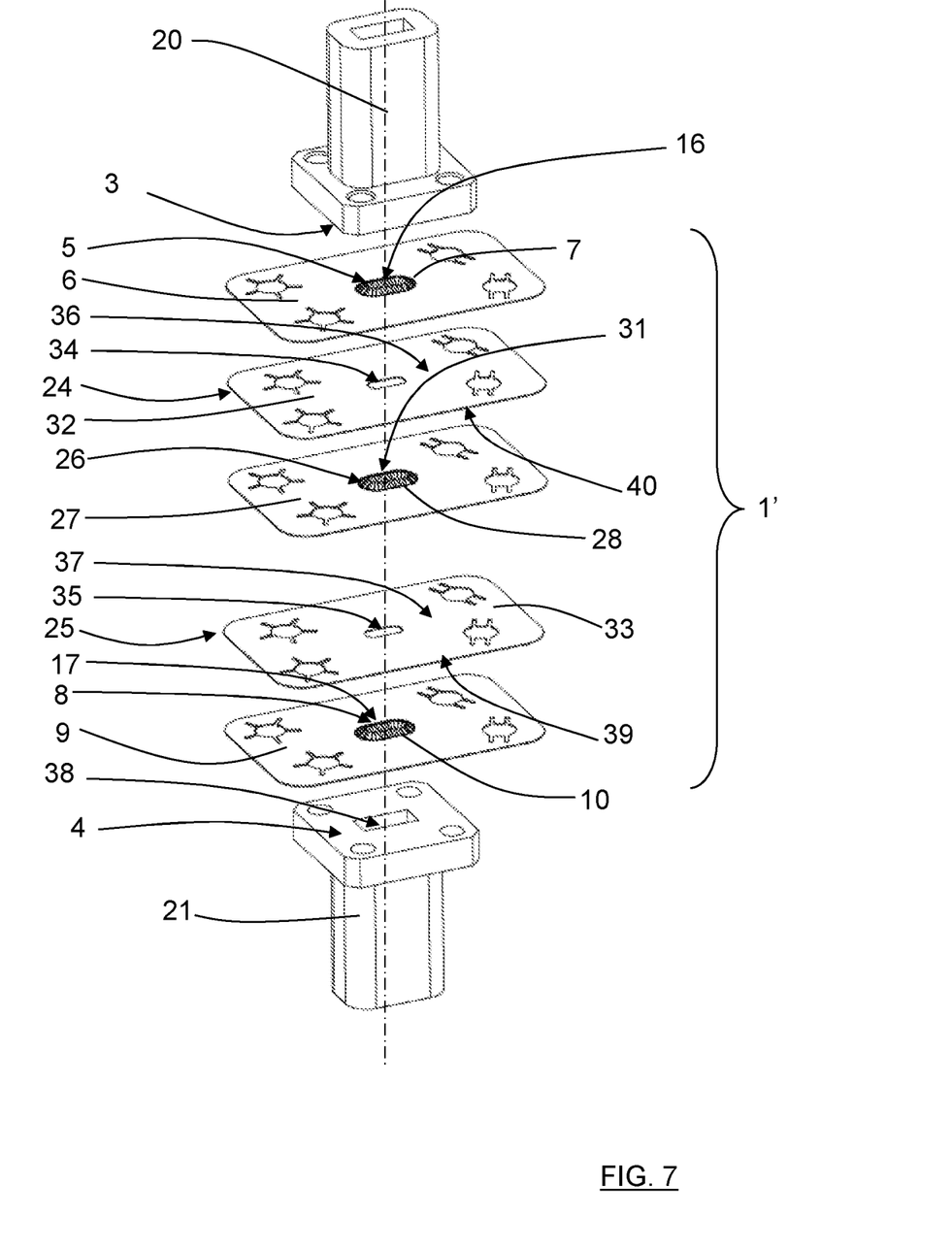
FIG. 7 shows a schematic perspective exploded view of a second example of a waveguide gasket arrangement together with two waveguide parts.

With reference to FIG. 7, showing a second example, the waveguide parts 20, 21 are the same as in the first example with a corresponding first waveguide end 3 and second waveguide end 4. There is an alternative waveguide gasket arrangement 1' arranged for electrically sealing a waveguide interface 2 between the first waveguide end 3 and the second waveguide end 4, where the alternative waveguide gasket arrangement 1' comprises further parts in addition to the parts in the first example, as will be described more in detail below.

Figure 8:
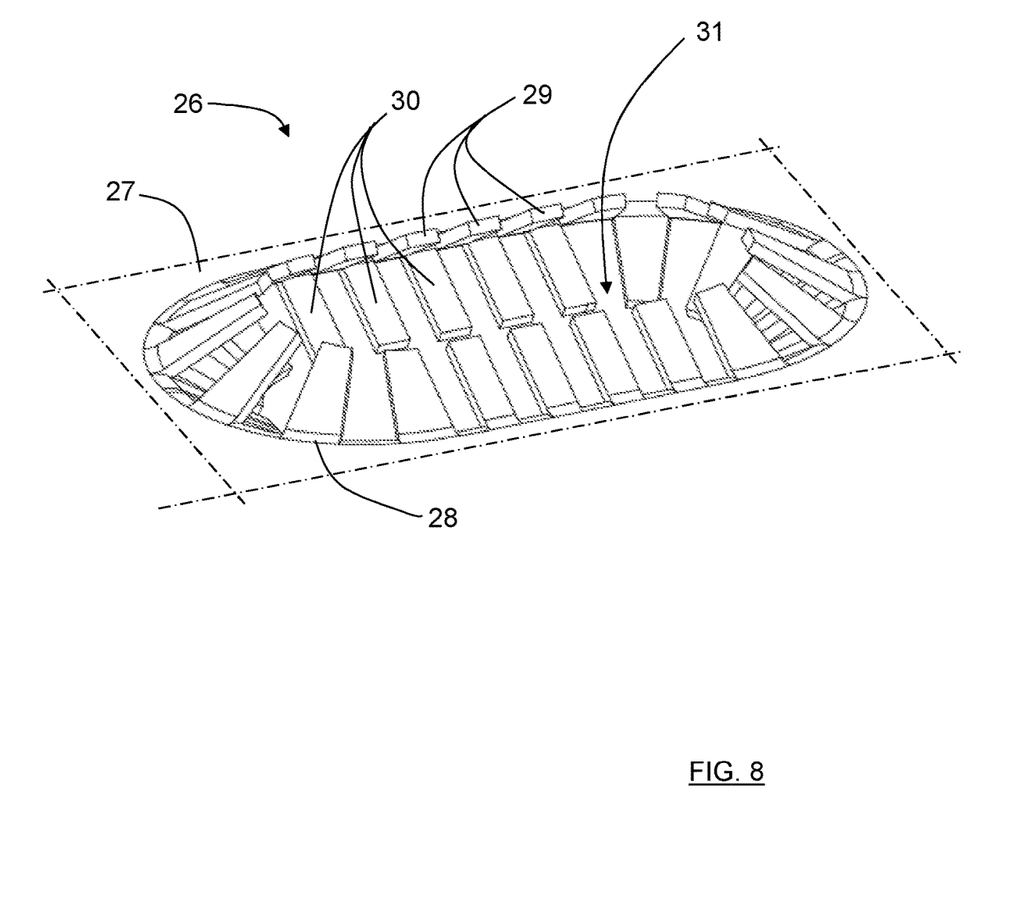
FIG. 8 shows a schematic perspective side view of a further plurality of electrically conducting members.

With reference also to FIG. 2, FIG. 4 and FIG. 8, the waveguide gasket arrangement 1 comprises a first plurality of electrically conducting members 5 connected to a first common structure 6 along a first circumference 7, a second plurality of electrically conducting members 8 connected to a second common structure 9 along a second circumference 10, and a third plurality of electrically conducting members 26 connected to a third common structure 27 along a third circumference 28.

According to some aspects, each plurality of electrically conducting members 5, 8, 26 circumvents a corresponding member aperture 16, 17, 31 and each common structure 6, 9, 27 is constituted by an electrically conducting sheet. The first plurality of electrically conducting members 5 comprises a first sub-plurality of electrically conducting members 11 which are intended to contact the first waveguide end 3, and a second sub-plurality of electrically conducting members 13 which are intended to contact a first intermediate electrically conducting structure 24. The second plurality of electrically conducting members 8 comprises a first sub-plurality of electrically conducting members 12 which are intended to contact the second waveguide end 4, and a second sub-plurality of electrically conducting members 14 which are intended to contact a second intermediate electrically conducting structure 25. The third plurality of electrically conducting members 26 comprises a first sub-plurality of electrically conducting members 29 which are intended to contact the first intermediate electrically conducting structure 24 and a second sub-plurality of electrically conducting members 30 which are intended to contact the second intermediate electrically conducting structure 25.

The first intermediate electrically conducting structure 24 is positioned between the first plurality of electrically conducting members 5 and the third plurality of electrically conducting members 26, and the second intermediate electrically conducting structure 25 is positioned between the second plurality of electrically conducting members 8 and the third plurality of electrically conducting members 26.

This means that for the first plurality of electrically conducting members 5 there are some conducting members forming the first sub-plurality of electrically conducting members 11 which are directed are directed towards, and are intended to contact, the first waveguide end 3, and some conducting members forming the second sub-plurality of electrically conducting members 13 which are directed are directed towards, and are intended to contact, a first side 36 the first intermediate electrically conducting structure 24.

This also means that for the second plurality of electrically conducting members 8 there are some conducting members forming the first sub-plurality of electrically conducting members 12 which are directed are directed towards, and are intended to contact, the second waveguide end 4, and some conducting members forming the second sub-plurality of electrically conducting members 14 which are directed are directed towards, and are intended to contact, a second side 39 of the second intermediate electrically conducting structure 25.

This furthermore means that for the third plurality of electrically conducting members 26 there are some conducting members forming the first sub-plurality of electrically conducting members 29 which are directed are directed towards, and are intended to contact, a second side 40 of the first intermediate electrically conducting structure 24, and some conducting members forming the second sub-plurality of electrically conducting members 30 which are directed are directed towards, and are intended to contact, a first side 37 of the second intermediate electrically conducting structure 25.

According to some aspects and with reference to FIG. 2, FIG. 4 and FIG. 8, in order to achieve this, for each plurality of electrically conducting members 5, 8, 26 every second conducting member is comprised in the first sub-plurality of electrically conducting members 11, 12, 29 and every other second conducting member is comprised in the second sub-plurality of electrically conducting members 13, 14, 30.

According to some aspects and with reference to FIG. 7, each one of the intermediate electrically conducting structures 24, 25 comprises a corresponding intermediate electrically conducting sheet 32, 33 with a corresponding intermediate aperture 34, 35, where all apertures 16, 34, 31, 35, 17 are adapted to be mutually aligned when the waveguide gasket arrangement 1' is arranged for electrically sealing the waveguide interface. Then, the apertures 16, 34, 31, 35, 17 are also aligned with waveguide openings 38 (only one shown in FIG. 7) such that a signal can be transferred from the first waveguide part 20 to the second waveguide part 21 via the apertures 16, 34, 31, 35, 17.

Figure 9:
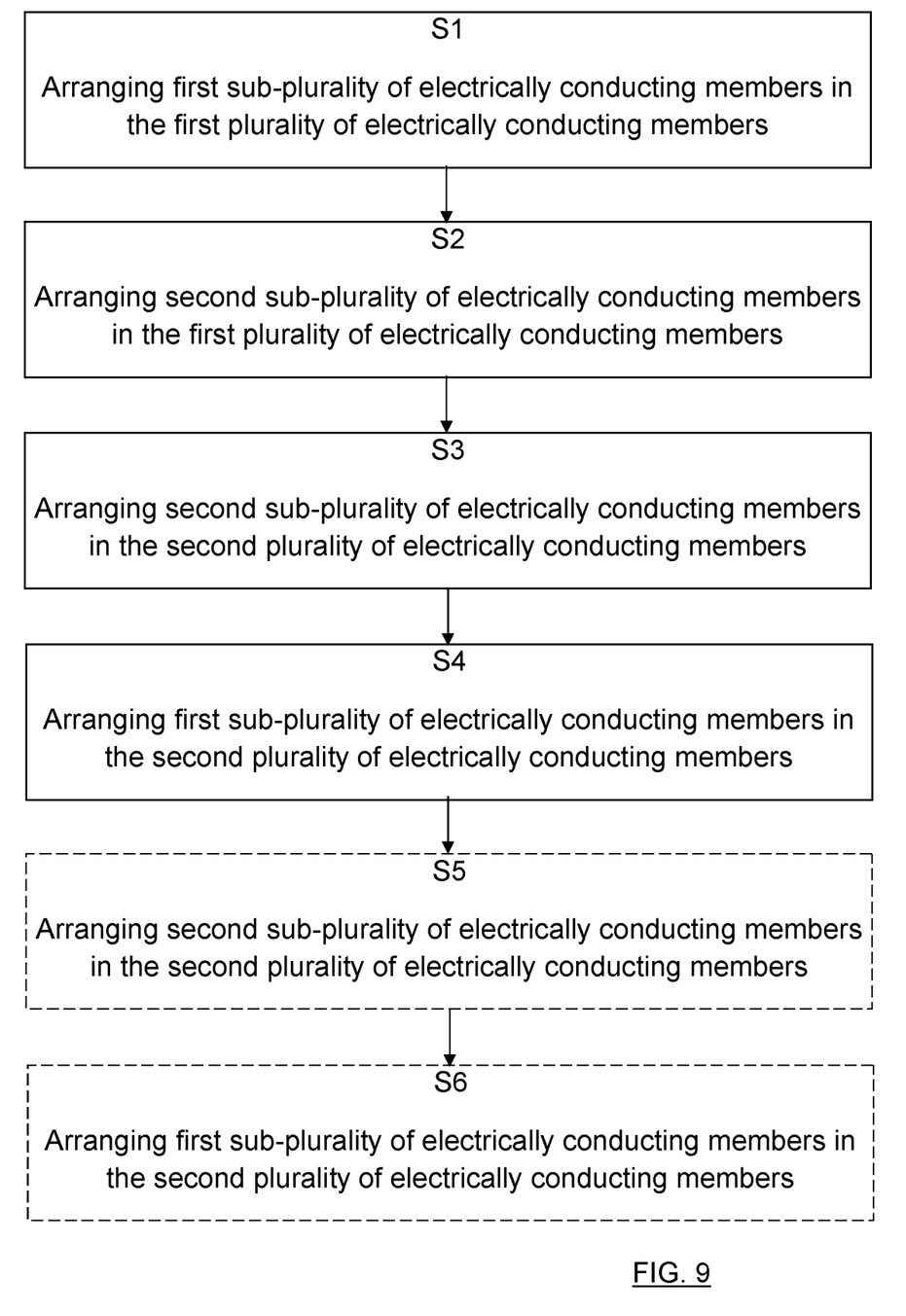
FIG. 9 shows a flowchart for methods according to the present disclosure.

With reference to FIG. 9, the present disclosure also relates to a method for configuring a waveguide interface 2 having a first waveguide end 3, a second waveguide end 4 and a waveguide gasket arrangement 1, 1'.

The method comprises arranging S1 a first sub-plurality of electrically conducting members 11 in the first plurality of electrically conducting members 5 to contact the first waveguide end 3, where the first plurality of electrically conducting members 5 is connected to a first common structure 6 along a first circumference 7 along which the waveguide gasket arrangement 1 extends. The method further comprises arranging S2 a second sub-plurality of electrically conducting members 13 in the first plurality of electrically conducting members 5 to contact a side 22; 36 of a corresponding intermediate electrically conducting structure 15; 24, 25 that is adapted to be positioned between the first plurality of electrically conducting members 5 and a second plurality of electrically conducting members 8. The second plurality of electrically conducting members 8 is connected to a second common structure 9 along a second circumference 10 along which the waveguide gasket 1 arrangement extends. The method further comprises arranging S3 a second sub-plurality of electrically conducting members 14 in the second plurality of electrically conducting members 8 to contact a side 23; 37 of a corresponding intermediate electrically conducting structure 15; 24, 25; and arranging S4 a first sub-plurality of electrically conducting members 12 in the second plurality of electrically conducting members 8 to contact the second waveguide end 4.

According to some aspects, the waveguide gasket arrangement 1' uses at least one further plurality of electrically conducting members 26 connected to a further common structure 27 along a further circumference 28, where, for each further plurality of electrically conducting members 26. The method further comprises arranging a first further sub-plurality of electrically conducting members 29 which is intended to contact one intermediate electrically conducting structure 24, and arranging a second further sub-plurality of electrically conducting members 30 which is intended to contact another intermediate electrically conducting structure 25. Each further plurality of electrically conducting members 26 is positioned between adjacent electrically conducting structures 24, 25.

According to some aspects, the method comprises forming the waveguide gasket arrangement 1, 1' in a metal material.

According to some aspects, the method comprises forming the waveguide gasket arrangement 1, 1' by punching structures in metal sheets.

According to some aspects, the method comprises forming the waveguide gasket arrangement 1, 1' in one piece.

The present disclosure is not limited to the above examples, but may vary freely within the scope of the appended claims. For example, there can be even more pluralities of electrically conducting members sandwiched with intermediate electrically conducting structures than described in the examples.

According to some aspects, the waveguide gasket arrangement 1, 1' is arranged for electrically sealing a waveguide interface between one of:
- a filter unit and an antenna arrangement;
- an isolator and a filter unit;
- a circulator and an antenna arrangement;
- a PCB (printed circuit board) and a filter unit; and/or
- microwave modules and other sub-units.

The waveguide openings 38 and the apertures 16, 34, 31, 35, 17 can have any suitable shape such as for example rectangular with sharp or rounded corners, oval or circular. The circumferences generally follow the shape of the corresponding apertures.

Generally, the present disclosure relates to a waveguide gasket arrangement 1, 1' arranged for electrically sealing a waveguide interface 2 between a first waveguide end 3 and a second waveguide end 4, where the waveguide gasket arrangement 1, 1' comprises a first plurality of electrically conducting members 5 connected to a first common structure 6 along a first circumference 7, wherein the waveguide gasket arrangement 1 comprises a second plurality of electrically conducting members 8 connected to a second common structure 9 along a second circumference 10. For each one of the first plurality of electrically conducting members 5 and the second plurality of electrically conducting members 5 there is:
- a corresponding first sub-plurality of electrically conducting members 11, 12 which are intended to contact a waveguide end 3, 4, and
- a second sub-plurality of electrically conducting members 13, 14 which are intended to contact a corresponding intermediate electrically conducting structure 15; 24, 25 that is positioned between the first plurality of electrically conducting members 5 and the second plurality of electrically conducting members 8.

According to some aspects, the second sub-pluralities of electrically conducting members 13, 14 are intended to contact opposite sides 22, 23 of an intermediate electrically conducting structure 15.

According to some aspects, the waveguide gasket arrangement 1' comprises at least one further plurality of electrically conducting members 26 connected to a further common structure 27 along a further circumference 28, where each further plurality of electrically conducting members 26 comprises
- a first further sub-plurality of electrically conducting members 29 which are intended to contact one intermediate electrically conducting structure 24, and
- a second further sub-plurality of electrically conducting members 30 which are intended to contact another intermediate electrically conducting structure 25.

Each further plurality of electrically conducting members 26 is positioned between adjacent electrically conducting structures 24, 25.

According to some aspects, each plurality of electrically conducting members 5, 8, 26 circumvent a corresponding member aperture 16, 17, 31.

According to some aspects, each intermediate electrically conducting structure 15; 24, 25 comprises an intermediate electrically conducting sheet 18; 32, 33 with an intermediate aperture 19; 34, 35, where all apertures 16, 17, 31; 34, 35 are adapted to be mutually aligned.

According to some aspects, each common structure 6, 9, 32 is constituted by a corresponding electrically conducting sheet.

According to some aspects, the waveguide gasket arrangement 1, 1' is formed in a metal material.

According to some aspects, the waveguide gasket arrangement 1, 1' is formed by means of punching structures in metal sheets.

According to some aspects, the waveguide gasket arrangement 1, 1' is formed in one piece.

According to some aspects, for each plurality of electrically conducting members 5, 8, 26, every second conducting member is comprised in the first sub-plurality of electrically conducting members 11, 12; 29, and every other second conducting member is comprised in the second sub-plurality of electrically conducting members 13, 14; 30.

The invention claimed is:

1. A waveguide gasket arrangement arranged for electrically sealing a waveguide interface between a first waveguide end and a second waveguide end, where the waveguide gasket arrangement comprises a first plurality of electrically conducting members connected to a first common structure along a first circumference, wherein the waveguide gasket arrangement comprises a second plurality of electrically conducting members connected to a second common structure along a second circumference, where, for each one of the first plurality of electrically conducting members and the second plurality of electrically conducting members there is:
    a corresponding first sub-plurality of electrically conducting members which are intended to contact a waveguide end, and
    a second sub-plurality of electrically conducting members which are intended to contact a corresponding intermediate electrically conducting structure that is positioned between the first plurality of electrically conducting members and the second plurality of electrically conducting members.

2. The waveguide gasket arrangement according to claim 1, wherein the second sub-pluralities of electrically conducting members are intended to contact opposite sides of an intermediate electrically conducting structure.

3. The waveguide gasket arrangement according to claim 1, wherein the waveguide gasket arrangement comprises at least one further plurality of electrically conducting members connected to a further common structure along a further circumference, where each further plurality of electrically conducting members comprises:
    a first further sub-plurality of electrically conducting members which are intended to contact one intermediate electrically conducting structure, and
    a second further sub-plurality of electrically conducting members which are intended to contact another intermediate electrically conducting structure
where each further plurality of electrically conducting members is positioned between adjacent electrically conducting structures.

4. The waveguide gasket arrangement according to claim 1, wherein each plurality of electrically conducting members circumvent a corresponding member aperture.

5. The waveguide gasket arrangement according to claim 4, wherein each intermediate electrically conducting structure comprises an intermediate electrically conducting sheet with an intermediate aperture, where all apertures are adapted to be mutually aligned.

6. The waveguide gasket arrangement according to claim 1, wherein each common structure is constituted by a corresponding electrically conducting sheet.

7. The waveguide gasket arrangement according to claim 1, wherein the waveguide gasket arrangement is formed in a metal material.

8. The waveguide gasket arrangement according to claim 7, wherein the waveguide gasket arrangement is formed by means of punching structures in metal sheets.

9. The waveguide gasket arrangement according to claim 1, wherein the waveguide gasket arrangement is formed in one piece.

10. The waveguide gasket arrangement according to claim 1, wherein, for each plurality of electrically conducting members, every second conducting member is comprised in the first sub-plurality of electrically conducting members, and every other second conducting member is comprised in the second sub-plurality of electrically conducting members.

11. A method for configuring a waveguide interface having a first waveguide end, a second waveguide end and a waveguide gasket arrangement, where the method comprises:
arranging a first sub-plurality of electrically conducting members in a first plurality of electrically conducting members to contact the first waveguide end, where the first plurality of electrically conducting members is connected to a first common structure along a first circumference along which the waveguide gasket arrangement extends;
arranging a second sub-plurality of electrically conducting members in the first plurality of electrically conducting members to contact a side of a corresponding intermediate electrically conducting structure that is adapted to be positioned between the first plurality of electrically conducting members and a second plurality of electrically conducting members, where the second plurality of electrically conducting members is connected to a second common structure along a second circumference along which the waveguide gasket arrangement extends;
arranging a second sub-plurality of electrically conducting members in the second plurality of electrically conducting members to contact a side of a corresponding intermediate electrically conducting structure; and
arranging a first sub-plurality of electrically conducting members in the second plurality of electrically conducting members to contact the second waveguide end.

12. The method according to claim 11, wherein the waveguide gasket arrangement uses at least one further plurality of electrically conducting members connected to a further common structure along a further circumference, where, for each further plurality of electrically conducting members, the method comprises:
arranging a first further sub-plurality of electrically conducting members which is intended to contact one intermediate electrically conducting structure, and
arranging a second further sub-plurality of electrically conducting members which is intended to contact another intermediate electrically conducting structure, where each further plurality of electrically conducting members is positioned between adjacent electrically conducting structures.

13. The method according to claim 11, wherein the method comprises forming the waveguide gasket arrangement in a metal material.

14. The method according to claim 13, the method comprises forming the waveguide gasket arrangement by punching structures in metal sheets.

15. The method according to claim 11, wherein the method comprises forming the waveguide gasket arrangement in one piece.

* * * * *